(12) United States Patent
Noujeim

(10) Patent No.: US 7,683,633 B2
(45) Date of Patent: Mar. 23, 2010

(54) APPARATUS FOR EXTENDING THE BANDWIDTH OF VECTOR NETWORK ANALYZER RECEIVERS

(75) Inventor: Karam Michael Noujeim, Sunnyvale, CA (US)

(73) Assignee: Anritsu Company, Morgan Hill, CA (US)

( * ) Notice: Subject to any disclaimer, the term of this patent is extended or adjusted under 35 U.S.C. 154(b) by 247 days.

(21) Appl. No.: 11/853,716

(22) Filed: Sep. 11, 2007

(65) Prior Publication Data
US 2008/0094072 A1 Apr. 24, 2008

Related U.S. Application Data

(60) Provisional application No. 60/862,180, filed on Oct. 19, 2006.

(51) Int. Cl.
*G01R 27/00* (2006.01)

(52) U.S. Cl. .................. 324/650; 324/630; 324/76.11
(58) Field of Classification Search .............. 324/630, 324/650, 76.11
See application file for complete search history.

(56) References Cited

U.S. PATENT DOCUMENTS

| 4,816,767 A * | 3/1989 | Cannon et al. ............ 324/601 |
| 2003/0125894 A1 * | 7/2003 | Dunsmore et al. ......... 702/109 |

* cited by examiner

*Primary Examiner*—Vincent Q Nguyen
(74) *Attorney, Agent, or Firm*—Fliesler Meyer LLP

(57) ABSTRACT

A system for measuring a frequency response of an electrical network includes a signal source, a signal source path, a reflectometer receiver interactively associated with the signal source path by a directional coupler, and one or more additional reflectometer receivers arranged in series along the signal source path and associated with the signal source path by one or more respective additional directional couplers. The directional coupler and one or more respective additional directional couplers operate at different frequency ranges.

20 Claims, 3 Drawing Sheets

APPARATUS FOR EXTENDING THE BANDWIDTH OF VECTOR NETWORK ANALYZER RECEIVERS

PRIORITY CLAIM

This application claims priority to the following U.S. Provisional Patent Application:

U.S. Provisional Patent Application No. 60/862,180, entitled "Apparatus for Extending the Bandwidth of Vector Network Analyzer Receivers," filed Oct. 19, 2006.

TECHNICAL FIELD

The present invention relates generally to network analyzers.

BACKGROUND OF THE INVENTION

A vector network analyzer (VNA) is a reflectometer-based electronic instrument that can be used to measure the frequency response (magnitude and phase) of a device under test (DUT) such as an electrical network, component, circuit, or sub-assembly. A VNA makes use of a frequency sweeping source or stimulus, directional couplers, and one or more receivers that provide ratioed amplitude and phase information such as reflection and transmission coefficients. Directional couplers are widely used in VNAs to separate the waves that are incident on, reflected from, and transmitted through a DUT. A directional coupler diverts signal power from a main line to which it is coupled. The wave-separation property of directional couplers makes them fundamental in VNA design. It can be desirable for a directional coupler to have good wave-separation across wide frequency ranges. This desire is driven at least in part by the fact that wide-band directional couplers make possible the design of wide-band VNAs. However, couplers in accordance with the prior art have limited bandwidth.

Referring to FIG. 1, a VNA 100 is shown connected to a DUT 110. The VNA makes use of a reflectometer receiver 102 for signal separation and detection. A reflectometer receiver 102 uses a local oscillator (LO) 108 to mix a radio frequency (RF) signal or stimulus from an RF source (also referred to herein as an input) 106 down to a lower intermediate frequency (IF) signal. The LO 108 is either phase-locked to the RF or the IF signal so that the reflectometer receiver 102 is tuned to the RF signal present at the RF source 106. The incident wave and related signal source paths are indicated by an "a" and the reflected wave and related signal source paths are indicated by a "b". The IF signals are band-pass-filtered to improve sensitivity and dynamic range and are provided to a processor/display 112.

BRIEF DESCRIPTION OF THE DRAWINGS

Further details of embodiments of the present invention are explained with the help of the attached drawings in which.

DETAILED DESCRIPTION

Figure 1:
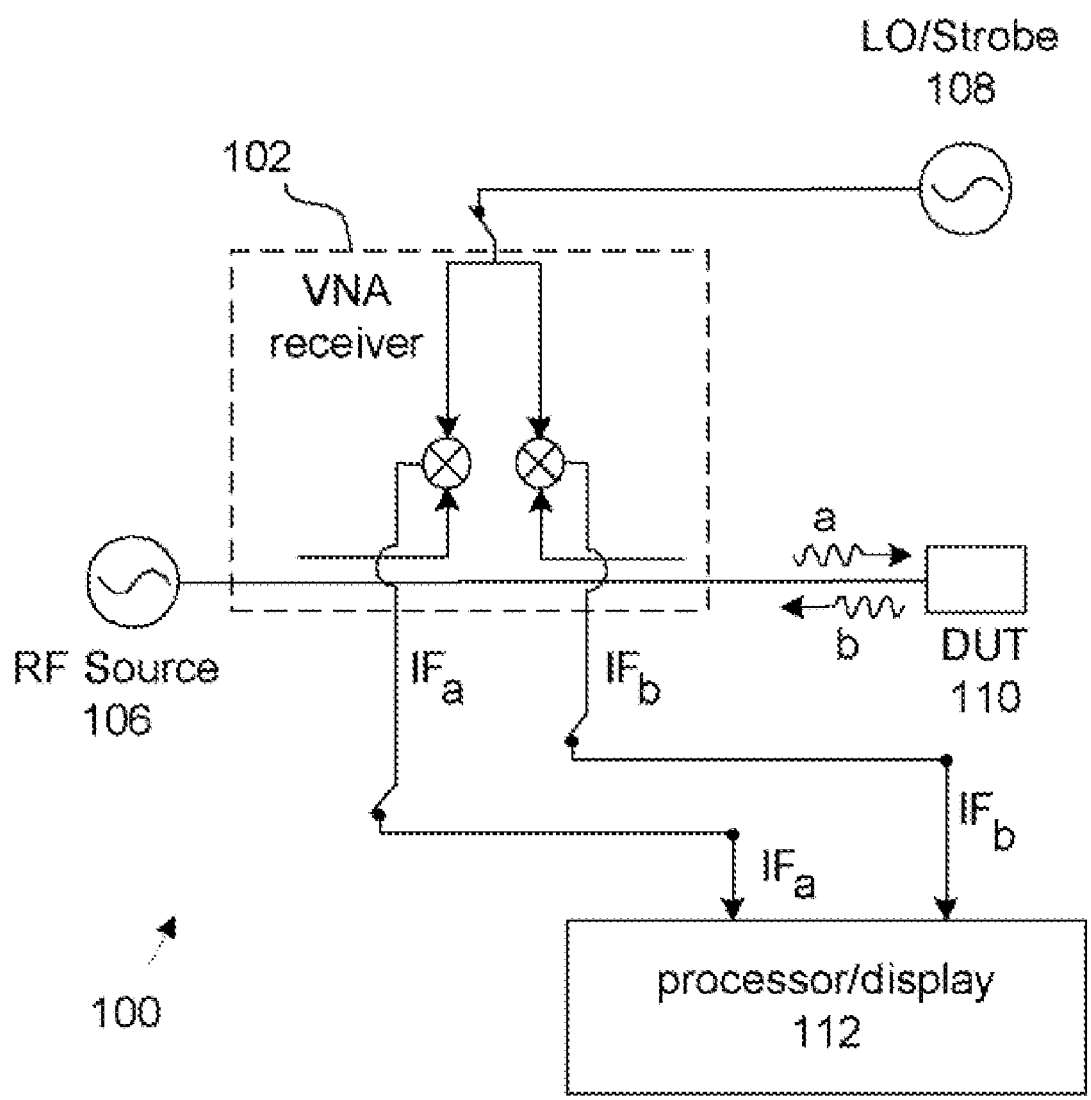
FIG. 1 is a circuit diagram of a system including a reflectometer receiver coupled to a signal source path connecting an RF source to a device under test in accordance with the prior art.
Figure 2:
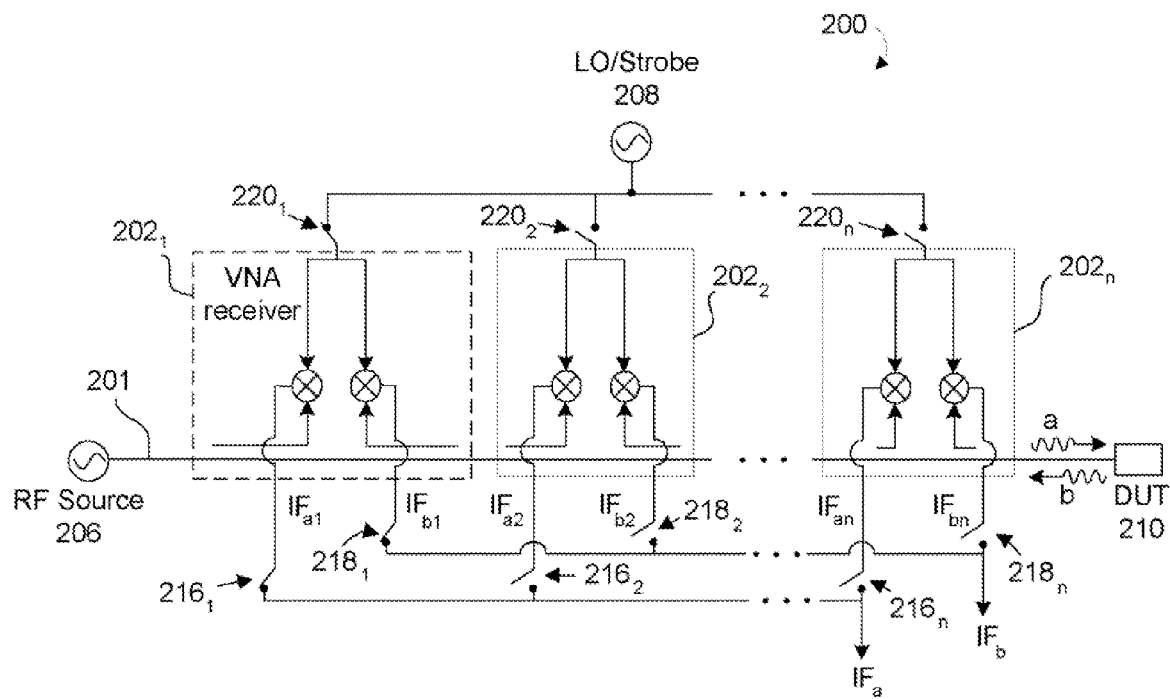
FIG. 2 is a circuit diagram of an embodiment of a system in accordance with the present invention having a broadened useable bandwidth, the system including a reflectometer receiver and one or more additional reflectometer receivers operating across different frequency ranges.

Embodiments of systems in accordance with the present invention can extend an operating bandwidth of a VNA by employing one or more integrated and/or remote reflectometer receivers disposed along an RF source path in addition to a VNA reflectometer receiver. An embodiment of one such system 200 is shown in FIG. 2. As above, the incident wave and related signal source paths are indicated by an "a" and the reflected wave and related signal source paths are indicated by a "b." A VNA reflectometer receiver $202_1$ is illustrated in simplified form interactively associated with an RF source path 201. An RF source 206 is connected to a device under test (DUT) 210 between which is disposed the RF source path 201. One or more integrated and/or remote additional reflectometer receivers $202_i$, i=2 . . . n are arranged serially along the RF source path 201 so that the additional reflectometer receivers $202_i$, i=2 . . . n can be interactively associated with the RF source path 201. An additional reflectometer receiver $202_i$ is activated when a frequency range of its couplers falls within the frequency range of the sweeping RF source. Reflectometer activation is achieved by connecting the main strobe source (LO 208) and the $IF_a$ and $IF_b$ channels to the appropriate ports of the reflectometer receiver $202_i$ by switches $216_i$, $218_i$, $220_i$, i=2 . . . n that connect the reflectometer receiver and provide a down-converted version of the signals that the couplers sense. The switches $216_i$, $218_i$, $220_i$, i=2 . . . n of a reflectometer are activated when the frequency range of the couplers and the sweeping RF source coincide. For example, in an embodiment, activation of switches $216_i$, $218_i$, $220_i$, i=2 . . . n can occur by way of software and/or hardware signals that detect or determine a frequency range of the sweeping RF source and control switch activation accordingly. Alternatively, switches for the appropriate reflectometer receiver $202_i$, i=2 . . . n can be activated by a user of the VNA to correspond with an observed frequency range of the sweeping RF source.

Additional reflectometer receivers $202_i$, i=2 . . . n can be selected to complement the VNA reflectometer receiver $202_1$ to operate within frequency ranges that collectively include substantially the entire frequency range targeted for an RF source 206. In some embodiments, the additional reflectometer receiver $202_i$, i=2 . . . n can be mixer or sampler based and the frequency ranges of the couplers of the VNA reflectometer receiver $202_1$ and the additional reflectometer receiver $202_i$, i=2 . . . n may or may not overlap. In other embodiments, the system can comprise still other components. Further, the VNA reflectometer receiver $202_1$ and/or the additional reflectometer receiver $202_i$, i=2 . . . n need not be limited to the arrangement shown in FIG. 2. In other embodiments, the VNA reflectometer receiver 202 and/or the additional reflectometer receiver $202_i$, i=2 . . . n can include more components than shown. Further, VNA reflectometer receiver 202 and/or the additional reflectometer receiver $202_i$, i=2 . . . n can include different components from one another. In still other embodiments, one or more of the additional reflectometer receivers $202_i$, i=2 . . . n can be remote (i.e. external) to the VNA. The embodiment of FIG. 2 is meant to demonstrate in a straight forward manner, a technique in which the present invention can be employed. One of ordinary skill in the art will appreciate in light of these teachings the myriad different variations with which systems employing reflectometers can be employed to expand an operating bandwidth of a VNA.

Figure 3:
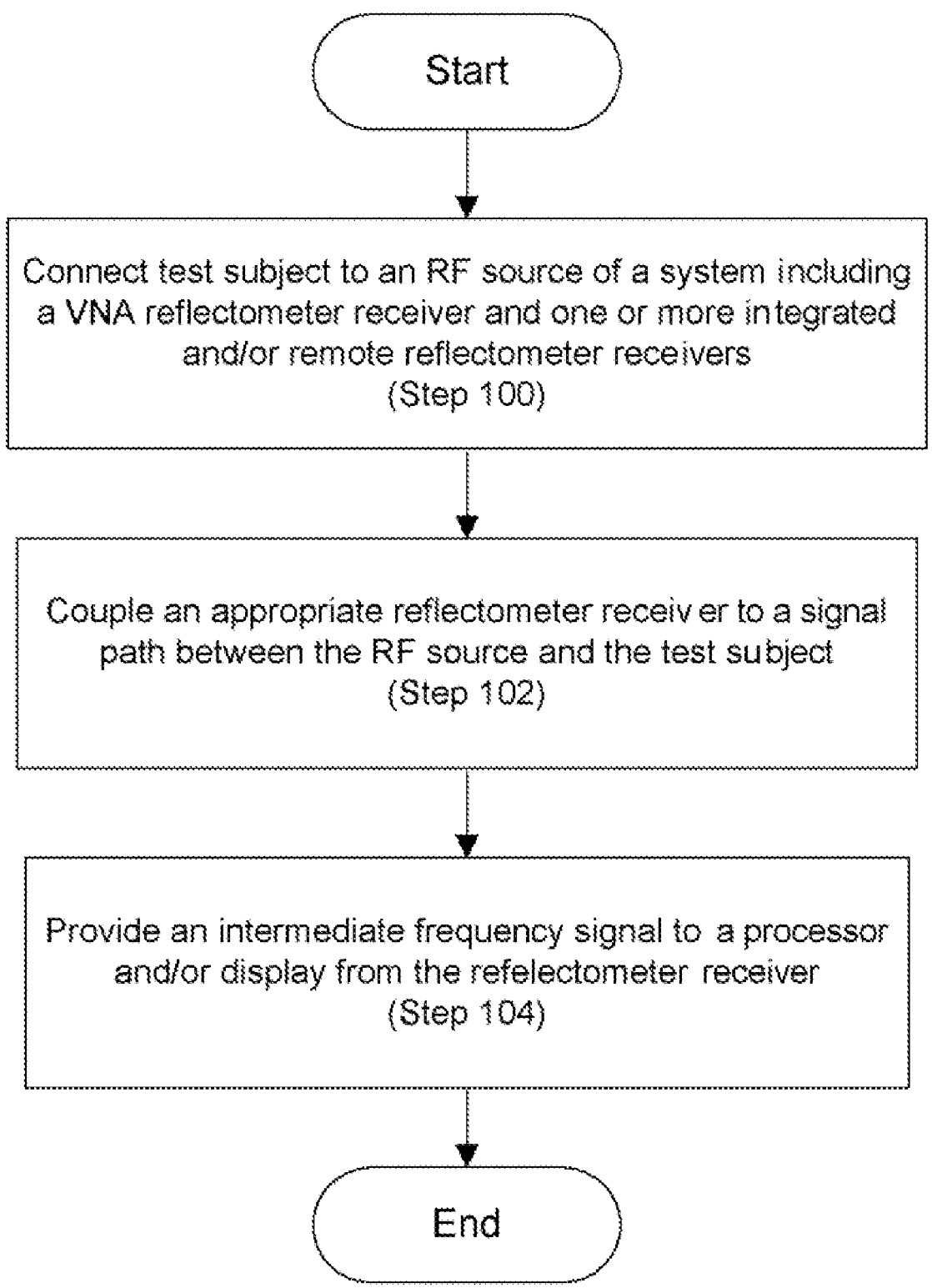
FIG. 3 is a flowchart of an embodiment of a method in accordance with the present invention for extending an operating bandwidth of a VNA receiver.

Referring to FIG. 3, embodiments of methods in accordance with the present can extend an operating bandwidth of a VNA by employing a reflectometer receiver and one or more integrated and/or remote additional reflectometer receivers disposed along an RF source path. In an embodiment of a method, a system—for example as described above employing one or more additional reflectometer receivers arranged serially along an RF source path associated with a RF source—can be connected with a test subject (the test subject becomes a DUT) (Step 100). An appropriate reflectometer receiver is coupled to the RF source path between the RF source and the test subject (Step 102). An appropriate reflectometer can be, in an embodiment, any reflectometer having an operating frequency within which the frequency of the RF signal falls. The reflectometer receiver provides an intermediate frequency signal to a processor and/or display for analysis (Step 104). The frequency bandwidth for which an intermediate frequency signal can be obtained is extended by the inclusion of the one or more additional reflectometer receivers in the system.

The foregoing description of preferred embodiments of the present invention has been provided for the purposes of illustration and description. It is not intended to be exhaustive or to limit the invention to the precise forms disclosed. Many modifications and variations will be apparent to one of ordinary skill in the relevant arts. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalence.

The invention claimed is:

1. A system for measuring a frequency response of an electrical network, comprising:
   a signal source;
   a signal source path;
   a reflectometer receiver interactively associable with the signal source path by a directional coupler; and
   an additional reflectometer receiver arranged in series along the signal source path and selectably associable with the signal source path by an additional directional coupler;
   wherein the directional coupler and additional directional coupler operate at different frequency ranges.

2. The system of claim 1, wherein a frequency range of the directional coupler overlaps a frequency range of the additional directional coupler.

3. The system of claim 1, wherein a frequency range of the directional coupler and a frequency range of the additional directional coupler are cascaded.

4. The system of claim 1, wherein the reflectometer receivers are adapted to provide an intermediate frequency signal when associated with the signal source path.

5. The system of claim 4, further comprising one or both of a processor and a display for receiving the intermediate frequency signal.

6. The system of claim 1, wherein the signal source is adapted to generate a radio frequency (RF) signal, and the system further comprising a local oscillator to mix the RF signal from the signal source to an intermediate frequency (IF) signal.

7. The system of claim 1, wherein one of the reflectometer receiver and the additional reflectometer receiver is associated with the signal source path by way of switches.

8. The system of claim 7, wherein the switches are controlled by one or both of hardware and software.

9. The system of claim 1, wherein components of the system are integrated into an apparatus.

10. The system of claim 1, wherein the signal source and the reflectometer receiver are integrated into an apparatus and the additional reflectometer is remote from the apparatus.

11. A system for measuring a frequency response of an electrical network, comprising:
    a signal source;
    a signal source path;
    a first reflectometer receiver electro-magnetically connectable with the signal source path by a first directional coupler when a signal having a frequency falling within a first frequency range is applied to the signal source path by the signal source; and
    one or more additional reflectometer receivers arranged in series along the signal source path, each additional reflectometer receiver being electro-magnetically connectable with the signal source path by a corresponding additional directional coupler when a signal having a frequency falling within a corresponding frequency range is applied to the signal source path by the signal source;
    wherein at least a portion of the first frequency range and each of the corresponding frequency ranges of the one or more additional reflectometer receivers is non-overlapping so that the frequency response of the electrical network is measurable over a frequency range broader than the first frequency range of the first reflectometer receiver.

12. The system of claim 11, wherein a frequency range of the directional coupler and a frequency range of the respective additional directional couplers are cascaded.

13. The system of claim 11, wherein the reflectometer receivers are adapted to provide an intermediate frequency signal when connected with the signal source path.

14. The system of claim 13, further comprising one or both of a processor and a display for receiving the intermediate frequency signal.

15. The system of claim 11, further comprising a local oscillator synchronized with the signal source of a reflectometer receiver associated with the signal source path.

16. The system of claim 11, wherein the first reflectometer receiver and the additional reflectometer receivers are connectable with the signal source path by way of switches.

17. The system of claim 16, wherein the switches are controlled by one or both of hardware and software.

18. The system of claim 11, wherein components of the system are integrated into an apparatus.

19. The system of claim 11, wherein the signal source and the first reflectometer receiver are integrated into an apparatus and at least one of the additional reflectometers is remote from the apparatus.

20. A method of extending an operating bandwidth of a VNA, the method comprising:
    connecting a radio frequency (RF) source to a test subject using an RF source path including a first reflectometer receiver and one or more additional reflectometer receivers arranged in series along an RF source path;
    wherein the first reflectometer receiver operates within a first frequency range and the one or more additional reflectometer receivers operates in corresponding frequency ranges;

wherein at least a portion of the first frequency range and each of the corresponding frequency ranges of the one or more additional reflectometer receivers is non-overlapping so that frequency response is measurable over a combined frequency range broader than the first frequency range, generating an RF signal from the RF source having a frequency within the combined frequency range;

generating an intermediate frequency signal from the RF signal; and providing the intermediate frequency signal to one or both of a processor and/or display.

* * * * *